United States Patent
Butscher et al.

(10) Patent No.: US 10,852,642 B2
(45) Date of Patent: Dec. 1, 2020

(54) CONTROL APPARATUS AND METHOD FOR CONTROLLING A MANIPULATOR IN RESPECT OF A MICROLITHOGRAPHIC PROJECTION EXPOSURE APPARATUS

(71) Applicant: Carl Zeiss SMT GmbH, Oberkochen (DE)

(72) Inventors: Bjoern Butscher, Aalen (DE); Christian Wald, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 16/734,082

(22) Filed: Jan. 3, 2020

(65) Prior Publication Data
US 2020/0225587 A1    Jul. 16, 2020

(30) Foreign Application Priority Data

Jan. 10, 2019   (DE) .................. 10 2019 200 218

(51) Int. Cl.
*G03F 7/20*   (2006.01)

(52) U.S. Cl.
CPC ........ G03F 7/70191 (2013.01); G03F 7/7015 (2013.01)

(58) Field of Classification Search
CPC .. G03F 7/70266; G03F 7/705; G03F 7/70233; G03F 7/70191; G03F 7/7015; G03F 7/70141
USPC .............................................. 355/52, 53, 67
See application file for complete search history.

(56) References Cited

U.S. PATENT DOCUMENTS

| | | | |
|---|---|---|---|
| 2010/0135569 A1 | 6/2010 | Berger | |
| 2013/0188246 A1 | 7/2013 | Rogalsky et al. | |
| 2016/0299436 A1* | 10/2016 | Rist | G03F 7/70425 |
| 2017/0115576 A1* | 4/2017 | Bittner | G03F 7/70258 |
| 2017/0219932 A1* | 8/2017 | Bittner | G03F 7/705 |

FOREIGN PATENT DOCUMENTS

| | | |
|---|---|---|
| DE | 10 2015 206 448 A1 | 10/2016 |
| DE | 102015206448 | 10/2016 |
| DE | 102015220537 | 10/2016 |
| DE | 102015222097 | 12/2016 |

(Continued)

OTHER PUBLICATIONS

H. Gross, 2005 Wiley-VCH Verlag GmbH & Co. KGaA, "Handbook of Optical Systems", vol. 2, p. 215.

(Continued)

*Primary Examiner* — Hung Nguyen
(74) *Attorney, Agent, or Firm* — Fish & Richardson P.C.

(57) ABSTRACT

A control apparatus controls at least one manipulator for modifying a parameter of a microlithographic projection exposure apparatus by generating a target for a travel variable, which defines a modification of the parameter to be undertaken via the manipulator. The control apparatus is configured to generate the target from a state characterization of the projection exposure apparatus by optimizing a merit function. A merit function includes at least one penalty term for taking account of a limit for a property of the projection exposure apparatus as an implicit constraint and the penalty term is formulated in such a way that the function value thereof tends to "infinity" as the property approaches the limit.

20 Claims, 4 Drawing Sheets

(56) References Cited

FOREIGN PATENT DOCUMENTS

| WO | WO 2010/034674 | 4/2010 |
| WO | WO 2010/034674 A1 | 4/2010 |

OTHER PUBLICATIONS

Daniel Malacara, John Wiley & Sons, Inc, text book "Optical shop testing", 2nd edition (1992).
Roy, Ranadhir: "Numerical comparison of different penalty modified barrier functions for optical tomography problems.", Proc. SPIE, Optical Tomography and Spectroscopy of Tissue VIII, vol. 7174, No. 717402, Feb. 23, 2009.
European Office Action, with translation, for corresponding Appl No. 20 150 217.6, dated Jun. 17, 2020.

* cited by examiner

CONTROL APPARATUS AND METHOD FOR CONTROLLING A MANIPULATOR IN RESPECT OF A MICROLITHOGRAPHIC PROJECTION EXPOSURE APPARATUS

CROSS-REFERENCE TO RELATED APPLICATIONS

This application claims priority to the German Patent Application No. 10 2019 200 218.8 filed on Jan. 10, 2019. The entire disclosure of this patent application is incorporated into the present application by reference.

FIELD

The disclosure relates to a control apparatus and a method for controlling at least one manipulator for modifying a parameter of a microlithographic projection exposure apparatus. Furthermore, the disclosure relates to an adjustment arrangement for adjusting a microlithographic projection lens and a microlithographic projection exposure apparatus, each with such a control apparatus.

BACKGROUND

A microlithographic projection exposure apparatus serves for the generation of structures on a substrate in the form of a semiconductor wafer during the production of semiconductor components. To this end, the projection exposure apparatus includes a projection lens having a plurality of optical elements, for imaging mask structures on the wafer during an exposure process.

A projection lens with wavefront aberrations that are as small as possible is used to enhance imaging of the mask structures on the wafer as precisely as possible. Therefore, projection lenses are equipped with manipulators, which render it possible to correct wavefront errors by modifying the state of individual optical elements of the projection lens. Examples for such a state modification include: a change in position in one or more of the six rigid body degrees of freedom of the relevant optical element, an impingement of the optical element with heat and/or coldness, a deformation of the optical element or a material ablation at an optical element via a post-processing device. Within the scope of this application, such a post-processing device is also understood as a manipulator of the projection lens in the general sense thereof.

Manipulator modifications to be carried out in order to correct an aberration characteristic of a projection lens are calculated via a travel-generating optimization algorithm, which is also referred to as "manipulator modification model". By way of example, such optimization algorithms are described in WO2010/034674A1 and DE10 2015 206 448 A1.

Thus, known optimization algorithms may be configured to solve the following optimization problem:

$$\min\|Mx-b_{mess}\|_2^2 \text{ where } F_j(x)\leq s_j \quad (1)$$

Such an optimization problem is configured to minimize the merit function, also referred to as figure-of-merit function, described by $\|Mx-b_{mess}\|_2^2$, taking into account constraints described by $F_j(x)\leq s_j$. Here, M denotes a sensitivity matrix, x denotes a travel vector with travels for the individual manipulators, $b_{mess}$ denotes a state vector of the projection lens, the state vector describing a measured aberration characteristic of the projection lens, $\|\ \|_2$ denotes the Euclidean norm, $F_j(x)$ denotes a suitable function for describing the constraints and $s_j$ denotes a respective fixed limit value for properties of the projection lens, such as, for instance, for parameters of the state vector b and/or for individual travels $x_j$.

Here, a "travel" is understood to mean a modification in a state variable of an optical element, carried out via manipulator actuation, for the purposes of modifying the optical effect thereof. Such a travel defined by a modification of a state variable of the optical element is specified by way of setpoint change quantities of the associated manipulator. By way of example, the manipulation can consist of a displacement of the optical element in a specific direction, but it can also consist of e.g. an impingement, in particular a local or two-dimensional impingement, of the optical element with heat, coldness, forces, torques, light with a specific wavelength or currents. Furthermore, the manipulation can define material ablation at an optical element, which is to be carried out via a post-processing device. By way of example, the setpoint change quantity can define a path length to be covered or an angular range to be covered in the case of a displacement.

The constraints defined by $F_j(x)\leq s_j$ provide hard limits for the relevant properties of the projection lens, which may not be exceeded. The poor scaling of the computation time with the size of the problem represents a substantial problem in this optimization method. Hence, a time-efficient calculation of travel targets is no longer achievable in the case of a relatively large number of manipulator degrees of freedom.

To shorten the calculation times, DE10 2015 206 448 A1 has disclosed an optimization method in which the limits defined by the constraints are taken into account via a penalty function contained in the merit function, wherein this penalty function is based on a power with an even exponent. However, this method no longer ensures the constraints being exactly observed under all conditions.

SUMMARY

The disclosure seeks to provide a control device and a method of the type set forth at the outset, by which the aforementioned issues are addressed and, in particular, a travel target can be ascertained in time-efficient manner under improved observance of a limit for a property of the projection exposure apparatus. In particular, the limit should be strictly observed.

According to the disclosure, for example, by a control apparatus for controlling at least one manipulator for modifying a parameter of a microlithographic projection exposure apparatus, in particular a parameter of at least one optical element of a microlithographic projection lens, by generating a target for a travel variable, which defines a modification of the parameter to be undertaken via the manipulator, wherein the control apparatus is configured to generate the target by optimizing a merit function from a state characterization of the projection exposure apparatus, in particular of the projection lens, the merit function includes at least one penalty term for taking account of a limit for a property of the projection exposure apparatus, in particular of the projection lens, as an implicit constraint and the penalty term is formulated in such a way that its function value tends to "infinity" as the property approaches the limit.

As mentioned above, the at least one manipulator controlled by the control apparatus can serve to modify a parameter of at least one optical element of a projection lens of the projection exposure apparatus. Additionally, the manipulator may also serve, in particular, to adjust a measurement mask or a sensor or the wavelength of illumination radiation. The limit for the property of the projection exposure apparatus can be an upper limit or a lower limit; in general, the limit defines one or more constraints. The penalty term should be understood to mean a term of the merit function, the function of the penalty term being that of, during the optimization, counteracting an approach of a value quantifying the property to the limit or at least of counteracting the value exceeding the limit.

As mentioned above, the control apparatus according to the disclosure is configured to generate the target for a travel variable from a state characterization of the projection exposure apparatus. Here, the state characterization need not be the only input quantity; rather, other input quantities, such as, e.g., an irradiance of the mask or a measured ambient pressure, can be taken into account by the control apparatus in addition to the state characterization for the purposes of ascertaining the target for the travel variable. The travel variable can be configured as a vector variable, the vector elements of which each define an adjustment, to be undertaken via a manipulator, of a parameter of an optical element of the projection lens.

The state characterization can be an imaging aberration of the projection lens. The latter can be available in the form of a Zernike image aberration or the form of a quantity derived from one or more Zernike image aberrations. Further, the imaging aberration can be a so-called lithographic error, i.e., an error in the aerial or wafer image of the mask structure, such as for instance an overlay error or an error in the line width.

According to the disclosure, the penalty term is formulated in such a way that its function value tends to "infinity" as the property approaches the limit. By way of example, this can be implemented via a logarithm function or a fractional-rational function. Formulating the penalty term in this way according to the disclosure effectively prevents the limit from being exceeded, as a result of which the observance of one or more constraints is ensured. At the same time, a time-efficient calculation of the travel target is facilitated by implicitly taking account of the constraint via the penalty term contained in the merit function. That is to say, the computational times of optimization can be kept low and, at the same time, the observance of constraints can be ensured.

According to one embodiment according to the disclosure, the penalty term includes a function that, at least in one section, is at least once continuously differentiable. Continuous differentiability allows the optimizer to use a gradient method. The solution can be found efficiently by way of a gradient method.

According to one embodiment variant, the section in which the function is at least once continuously differentiable makes up more than 90%, in particular more than 98%, more than 99%, more than 99.9% or more than 99.99% of a domain of the function restricted by practical boundary conditions. Restricting the domain by practical boundary conditions should be understood to mean that the argument of the function cannot, in practice, assume all values of the maximum domain possible from a mathematical point of view on account of boundary conditions of the manipulation system and/or of the projection exposure apparatus. For instance, an image aberration might thus not be able to be reduced all the way to zero; instead it may only approach the absolute value of zero down to a certain value. In particular, a domain that, from a mathematical point of view, has a lower or upper limit of $-\infty$ or $+\infty$ is restricted to a finite numerical value by practical boundary conditions.

According to a further embodiment, the function is available in a numerical representation with a minimum increment. Here, continuous differentiability is satisfied by virtue of the fact that, at each point of the section whose function value exceeds the smallest number representable in a calculation programme of the control apparatus by a factor of 10, a function value, determined by linear approximation, of an associated approximation point deviates by no more than 50% from the actual function value, in particular by no more than 20%, no more than 10%, no more than 5% or no by more than 1% from the actual function value. The approximation point associated with the respective point is spaced apart from the point by at least twice the minimum increment, in particular by at least five times or at least ten times the minimum increment. In particular, this applies to each point of the section whose function value exceeds the smallest number representable in the calculation programme of the control apparatus by a factor of 1000 or $10^6$. According to a further embodiment, the function, in at least one section, is at least twice continuously differentiable. This allows the optimizer to find a target ascertained via a gradient method more quickly via the second derivative.

According to one embodiment variant, the function is available in a numerical representation with a minimum increment and the at least two-fold continuous differentiability is satisfied by virtue of the fact that, at each point of the section whose function value exceeds the smallest number representable in a calculation programme of the control apparatus by a factor of 10, a function value, determined by quadratic approximation, of an associated approximation point deviates by no more than 50% from the actual function value, in particular no more than 20%, no more than 10%, no more than 5% or no more than 1% from the actual function value, wherein the approximation point associated with the respective point is spaced apart from the point by at least twice the minimum increment, in particular at least five times or at least ten times the minimum increment. In particular, this applies to each point of the section whose function value exceeds the smallest number representable in the calculation programme of the control apparatus by a factor of 1000 or $10^6$.

According to a further embodiment, the penalty term at least approximately includes a logarithm function and/or a fractional-rational function. These functions allow the limit to be observed in particularly effective fashion. In the case of the logarithm function, the latter can be available as an analytical function, or else however in the tabular representation. Here, the specification "at least approximately" should be understood to mean that the penalty term includes a function that is represented by a logarithm function and/or a fractional-rational function or the penalty term is at least so similar to these functions that the effect thereof in the penalty term is comparable to the aforementioned functions.

According to a further embodiment, the penalty term is formulated in such a way that its function value is defined as "infinite" when the limit is exceeded. If the optimization algorithm uses relatively large increments, the limit may be exceeded despite the aforementioned formulation of the penalty term with the limit value running counter to "infinity". By defining the functional value of the penalty term to be "infinity" when the limit is exceeded, it is possible to ensure that the exceeding is undone within the further scope of the optimization, for instance if the limit is exceeded by the use of relatively large increments during the optimization.

According to a further embodiment, the control apparatus is configured to implement the target by optimizing the merit function via the travel variables, which serve as first optimization variable, and via a further optimization variable of another category. The further optimization variable of another category should be understood to mean that this optimization variable is not a travel variable of a manipulator.

According to a further embodiment, the further optimization variable includes a scaling factor for scaling the limit. According to one embodiment variant, the merit function includes a further penalty term for limiting the value of the scaling factor. By way of example, this penalty term may include the scaling factor to the power two or a higher power.

According to a further embodiment, the limit includes a plurality of individual limit values for a respective property of the projection exposure apparatus and the further optimization variable includes a plurality of scaling factors for scaling the individual limit values and a group limit value, which may not be exceeded by at least one of the individual limit values.

The further penalty term of the merit function is configured to limit the values of both the scaling factors and the group limit value. Furthermore, the further optimization variable may include a plurality of group limit values and a supra-group limit value, wherein the group limit values relate to different groups of scaling factors and the supra-group limit value are not to be exceeded by any of the group limit values. According to a further embodiment, the merit function may include a further penalty term for limiting the group limit value. This concept can be extended to further cascading with supra-supra-group limit values.

According to further embodiments, the property of the projection exposure apparatus for which the penalty term includes a limit includes an imaging aberration of a projection lens of the projection exposure apparatus and/or the target for the travel variable. In the variant in which the property includes at least the target for the travel variable, the first penalty term relates to a boundary condition for at least one of the manipulator travels. In particular, the first penalty term may include a respective limit for at least one imaging aberration and for at least one travel variable.

Furthermore, an adjustment arrangement for adjusting a microlithographic projection lens is provided according to the disclosure. The adjustment arrangement according to the disclosure includes a measurement apparatus for ascertaining a state characterization of the projection lens and a control apparatus according to any one of the preceding embodiments or embodiment variants for generating the target for a travel variable from the state characterization.

Furthermore, a microlithographic projection exposure apparatus is provided according to the disclosure. The projection exposure apparatus according to the disclosure includes at least one manipulator, which is configured to modify a parameter of an optical element of the projection exposure apparatus, and a control apparatus according to any one of the preceding embodiments or embodiment variants for controlling the at least one manipulator. According to one embodiment, the at least one manipulator is configured to modify a parameter of an optical element of a projection lens of the projection exposure apparatus.

By way of example, the disclosure provides a method for controlling at least one manipulator for modifying a parameter of a projection exposure apparatus, in particular at least one optical element of a microlithographic projection lens. The method according to the disclosure includes generating a target for a travel variable for the at least one manipulator from a state characterization of the projection exposure apparatus, in particular of the projection lens, by optimizing a merit function, wherein the merit function includes at least one penalty term for taking account of a limit for a property of the projection lens as an implicit constraint and the penalty term is formulated in such a way that its function value tends to "infinity" as the property approaches the limit. Furthermore, the method according to the disclosure includes modifying the parameter of the projection exposure apparatus, in particular of the at least one optical element of the projection lens, via the at least one manipulator on the basis of the generated target for the travel variable.

The features specified with respect to the embodiments, exemplary embodiments and embodiment variants etc., of the control apparatus according to the disclosure, listed above, can be accordingly transferred to the control method according to the disclosure. These and other features of the embodiments according to the disclosure are explained in the description of the figures and in the claims. The individual features can be implemented, either separately or in combination, as embodiments of the disclosure. Furthermore, they can describe advantageous embodiments which are independently protectable and protection for which is claimed if appropriate only during or after pendency of the application.

BRIEF DESCRIPTION OF THE DRAWINGS

The above and further advantageous features of the disclosure are illustrated in the following detailed description of exemplary embodiments according to the disclosure with reference to the accompanying schematic drawings, in which.

DETAILED DESCRIPTION OF EXEMPLARY EMBODIMENTS

In the exemplary embodiments or embodiments or embodiment variants described below, elements which are functionally or structurally similar to one another are provided with the same or similar reference signs as far as possible. Therefore, for understanding the features of the individual elements of a specific exemplary embodiment, reference should be made to the description of other exemplary embodiments or the general description of the disclosure.

Figure 1:
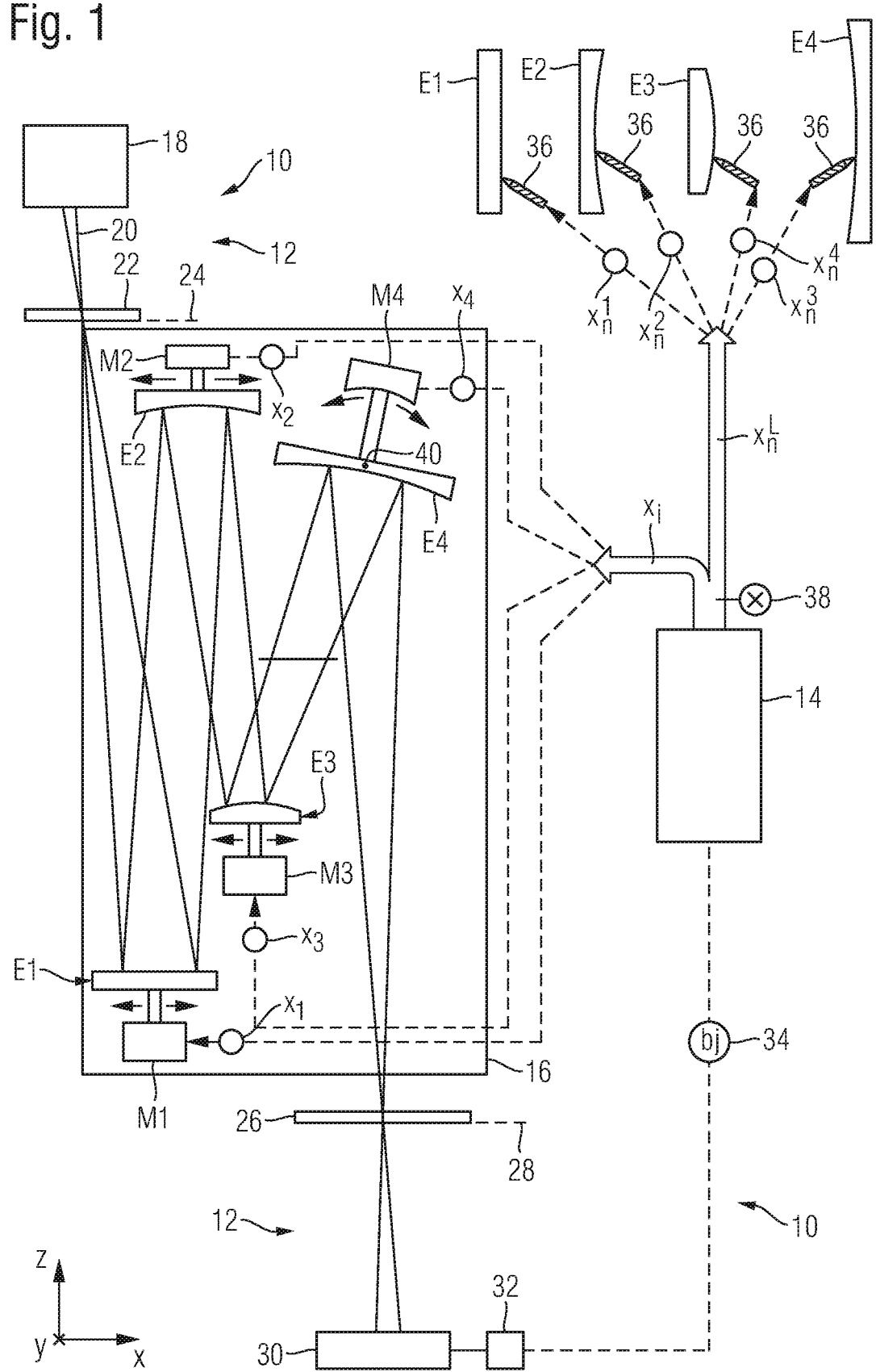
FIG. 1 shows a visualization of an embodiment according to the disclosure of an adjustment arrangement for adjusting a microlithographic projection lens with a measurement apparatus for ascertaining a state characterization of the projection lens and a control apparatus for controlling manipulations integrated in the projection lens and manipulators in the form of a post-processing device.

In order to facilitate the description, a Cartesian xyz-coordinate system is indicated in the drawing, from which system the respective positional relationship of the components illustrated in the figures is evident. In FIG. 1, the y-direction extends perpendicularly to the plane of the drawing into the plane, the x-direction extends toward the right, and the z-direction extends upward.

FIG. 1 shows an adjustment arrangement 10 for adjusting a projection lens 16 of a microlithographic projection exposure apparatus. Here, the individual components of the adjustment arrangement can be disposed separately from one another or, alternatively, integrated in a single apparatus. The adjustment apparatus 10 includes a measurement apparatus 12 for ascertaining a state characterization 34 of the projection lens 16 and a control apparatus 14 in the form of a so-called travel ascertaining device for generating a travel command 38 from the state characterization 34.

The projection lens 16 serves to image mask structures from an object plane 24 into an image plane 28 and it can be designed for exposure radiation at different wavelengths, such as e.g. 248 nm or 193 nm. In the present embodiment, the projection lens 16 is designed for a wavelength in the EUV wavelength range, e.g. 13.5 nm.

The measurement apparatus 12 is configured to measure wavefront errors of the projection lens 16 and it includes an illumination device 18 and a measurement mask 22 on the entrance side of the projection lens 16 and a sensor element 26, a detector 30 and an evaluation device 32 on the exit side of the projection lens. In FIG. 1, the measurement mask 22 is illustrated as an element operated in transmission. However, according to a preferred embodiment, the measurement mask 22 is operated in reflection. The illumination device 18 is configured to generate measurement radiation 20 at the operating wavelength of the projection lens 16 to be tested, in the present case in the form of EUV radiation, and to radiate the radiation onto the measurement mask 22, which is disposed in the object plane 24. Within the scope of this application, EUV radiation should be understood to mean electromagnetic radiation with a wavelength of less than 100 nm, in particular a wavelength of approximately 13.5 nm or approximately 6.7 nm. The measurement mask 22, which is often also referred to as a "coherence mask", has a first periodic structure. The sensor element 26 in the form of an image grating, which has a second periodic structure, is disposed in the image plane 28. It is also possible to combine chequerboard structures in the measurement mask 22 with chequerboard structures in the sensor element 26. It is also possible to use other combinations of periodic structures known to a person skilled in the art from the field of shearing interferometry or point diffraction interferometry. In FIG. 1, the sensor element 26 is illustrated as an element operated in transmission; however, in particular, the sensor element 26 can also be operated in reflection.

A detector 30 in the form of a camera, which resolves in two dimensions, is disposed below the sensor element 26, to be precise in a plane conjugate to the pupil plane of the projection lens 16. Together, the sensor element 26 and the detector 30 form a sensor module. The measurement mask 22 and the sensor module form a shearing interferometer or point diffraction interferometer, known to a person skilled in the art, and serve to measure wavefront errors of the projection lens 16. To this end, phase shifting methods, which are known to a person skilled in the art, are applied in particular.

The evaluation device 32 ascertains the state characterization 34 of the projection lens 16 from the intensity patterns recorded by the detector 30. In accordance with the present embodiment, the state characterization 34 includes a set of Zernike coefficients bj characterizing the wavefront errors of the projection lens 16.

In the present application, the Zernike functions $Z_m^n$, as known from e.g. Chapter 13.2.3 in the textbook "Optical Shop Testing", 2$^{nd}$ Edition (1992) by Daniel Malacara, pub. John Wiley & Sons, Inc., are denoted by $Z_j$ in accordance with the so-called fringe sorting, as described in e.g. paragraphs [0125]-[0129] in US 2013/0188246A1, with $b_j$ then being the Zernike coefficients assigned to the respective Zernike polynomials (also referred to as "Zernike functions"). Fringe sorting is illustrated for example in Table 20-2 on page 215 of "Handbook of Optical Systems", Vol. 2 by H. Gross, 2005 Wiley-VCH Verlag GmbH & Co. KGaA, Weinheim. A wavefront deviation W(ρ,Φ) at a point in the image plane of the projection lens is expanded depending on the polar coordinates (ρ, Φ) in the pupil plane as follows:

$$W(\rho, \Phi) = \sum_j b_j \cdot Z_j(\rho, \Phi) \quad (2)$$

While the Zernike polynomials are denoted by $Z_j$, i.e. with the subscript index j, the Zernike coefficients are denoted by $b_j$ within the scope of this application. It should be noted here that the Zernike coefficients $b_j$ are often also denoted by Zj, i.e. with a normally written index, in the specialist world, such as e.g. Z5 and Z6 representing astigmatism.

The state characterization 34 ascertained by the evaluation device 32 of the measurement apparatus 12 is transferred to the control apparatus 14, which generates the travel command 38 in the form of a travel variable x therefrom. In the present embodiment, the travel variable x has the form of a vector and includes travels $x_i$ and travels $x_n^L$. These travels $x_i$ serve to control manipulators $M_s$ of the projection lens 16, while the travels $x_n^L$ serve to control a post-processing device 36 for mechanical post-processing of optical elements of the projection lens 16. Within the scope of this application, both the manipulators $M_s$ and the post-processing device 36 are understood to be manipulators for the projection lens 16 in the general sense. In general, the travel command 38 with the travels $x_i$ and the travels $x_n^L$ includes targets for travel variables, which define modifications, to be undertaken via manipulators, of a respective parameter of one or more optical elements of the projection lens 16, wherein the parameters, to be modified, of the optical elements may include, in particular, position arrangements of the optical elements that are adjustable via the manipulators $M_s$ or form states that can be undertaken via the post-processing device 36.

The projection lens 16 only has four optical elements E1 to E4 in the embodiment in accordance with FIG. 1. All optical elements are mounted in a movable manner. To this end, a respective manipulator $M_s$, in particular respectively one of the manipulators M1 to M4, is assigned to each one of the optical elements E1 to E4. The manipulators M1, M2 and M3 each enable a displacement of the assigned optical elements E1, E2 and E3 in the x- and y-direction and therefore substantially parallel to the plane in which the respective reflecting surface of the optical elements lies.

The manipulator M4 is configured to tilt the optical element E4 by rotation about a tilt axis 40 disposed parallel to the y-axis. As a result, the angle of the reflecting surface of E4 is modified in relation to the incident radiation. Further degrees of freedom for the manipulators are conceivable. Thus, for example, provision can be made for a displacement of a relevant optical element across the optical surface thereof or for a rotation about a reference axis perpendicular to the reflecting surface.

In general terms, each one of the manipulators M1 to M4 illustrated here is provided, by way of a displacement of the assigned optical element E1 to E4 while performing a rigid body movement along a predetermined travel, to bring about a modification of a parameter of a corresponding optical element. By way of example, such a travel can combine translations in different directions, tilts and/or rotations in any manner. Alternatively or additionally, it is also possible to provide manipulators which are configured to undertake a different mannered modification of a parameter of the assigned optical element by an appropriate actuation of the manipulator. In this respect, an actuation can be carried out by e.g. applying a specific temperature distribution or a specific force distribution to the optical element. In this case, the travel can be as a result of a modification of the temperature distribution on the optical element or the application of local tension to an optical element embodied as a deformable lens or as a deformable mirror.

In the shown case, the travels $x_i$ included by the travel command 38 contain the travels $x_1$, $x_2$, $x_3$ and $x_4$, which predetermine modifications of at least one parameter of one or more of the optical elements E1 to E4 to be carried out by the manipulators M1 to M4 and which therefore serve to control the manipulators M1 to M4 of the projection lens 16. The ascertained travels $x_1$ to $x_4$ are transferred to the individual manipulators M1 to M4 by way of travel signals and they provide the manipulators with respective correction travels to be carried out. These define corresponding displacements of the assigned optical elements E1 to E4 for correcting wavefront errors of the projection lens 16 that occurred. In the case where a manipulator has a plurality of degrees of freedom, it is also possible to transfer a plurality of travels $x_i$ thereto.

The travels $x_n^L$ furthermore included by the travel command 38 contain the travels $x_n^1$, $x_n^2$, $x_n^3$ and $x_n^4$ in the shown case, which travels serve to control the post-processing device 36 for the respective mechanical post-processing of the optical elements E1, E2, E3 and E4 of the projection lens 16 and hence likewise serve to modify at least one parameter of one or more of the optical elements E1 to E4. Therefore, like the travels $x_1$ to $x_4$, the travels $x_n^1$ to $x_n^4$ serve to correct wavefront errors of the projection lens 16 that occurred. The post-processing device 36 should be understood to mean a device for mechanical ablation of material at an optical surface of an optical element in the form of a lens or mirror. This ablation is subsequent to the production of the optical element and it serves, in particular, to modify the shape of a surface. The modification of the surface shape, to be undertaken, is aspherical in this case (moreover, it need not be rotationally symmetric either). Therefore, the surface to be modified is referred to as a correction asphere. In particular, an optical element already assembled in the projection lens 16 can be removed for post-processing purposes and can be subsequently assembled back in the projection lens. In particular, an ablation device usually used for the mechanical processing of correction aspheres can be used as a post-processing device 36. Therefore, the ablations are also referred to as "correction asphere ablations" below. By way of example, an ion beam can be used for mechanical processing. Using this, it is possible to work any correction profile into an optical element to be post-processed.

In addition to the above-described travels $x_i$ for the manipulator system, which may be permanently or temporarily connected to the control apparatus 14 (the manipulators M1 to M4 in the present exemplary embodiment) and the travels $x_n^L$ for the correction asphere post-processing device 36, the travel command 38 may also include further travels according to further embodiments, not elucidated here in detail. These may include travels for adjusting further degrees of freedom that are permanently actuatable via the control apparatus 14, such as the operating wavelength or the position of the measurement mask 22 or of the sensor element 26. Furthermore, these travels may include manually manipulable degrees of freedoms and travels defining interventions in the mechanical structure of the projection lens 16. Such interventions may relate to a change in adjustment rings or frame positions, which involve a partial disassembly and reassembly of the lens, and hence usually also involve the lens to be removed from an adjustment arrangement.

The functionality of the control apparatus 14 is visualized below in exemplary fashion with reference to FIG. 2. It is configured to carry out a travel-generating optimization algorithm 41. The optimization algorithm 41 serves to optimize a merit function H, which is denoted by the reference sign 42 in FIG. 2.

As already mentioned above, the travels of the travel command 38 to be generated by the optimization algorithm are described by a vector-type travel variable x, which include the travels $x_i$ of the manipulators M1 to M4 provided in the projection lens 16 and the travels $x_n^L$ of the controller of the correction asphere post-processing device 36. The state characterization 34 is described by a state vector b, the vector components of which in the embodiment described here are the aforementioned Zernike coefficients $b_j$. The Zernike coefficients $b_j$ are also referred to as state parameters. According to further embodiments, the state vector b may include, in addition to Zernike coefficients or an alternative thereto, parameters of aerial image quantities and/or a direct two-dimensional wavefront representation and/or quantities derived from the aforementioned quantities, such as linear combinations, for example.

The sensitivities of the manipulators, in the present case the manipulators M1 to M4 and the post-processing device 36, in relation to the degrees of freedom thereof in the case of a state modification are described via a sensitivity matrix M in accordance with one embodiment variant. Here, the sensitivity matrix M describes the relationship between an adjustment of a degree of freedom i of a manipulator by a standard travel $x_i^0$ and a modification, resulting therefrom, of the state vector b of the projection lens 16. The individual rows of the sensitivity matrix M relating to one of the Zernike coefficients $b_j$ in each case are denoted by $M_j$ in FIG. 2.

In the embodiment according to FIG. 2, the merit function H is formulated as a function of the travel variables x and a scaling quantity t (reference sign 43) explained in more detail below. The scaling quantity t includes one or more scaling factors $t_j$ (reference sign 43a) for scaling a respective limit value $a_j$ which are not to be exceeded by a respective property of the projection lens 16, in the form of the corresponding Zernike coefficient $b_j$ (reference sign 34) in the present exemplary embodiment, during the optimization of the merit function. Here, the limit values $a_j$ are scaled by the scaling factors $t_j$ in relation to a respective initial limit value $s_j$ ($a_j = t_j \cdot s_j$). The totality of limit values $a_j$ is referred to as limit a (reference sign 44). Limit values $a_j$ are also referred to as individual limit values in this text. According to a further embodiment, not illustrated in more detail in FIG. 2, the limit a may also include limit values for further properties of the projection lens 16 in addition to the limit values for the Zernike coefficients $b_j$. These may include limit values $a_{Mi}$, for the travels $x_i$ of the manipulator system M1 to M4 or 36. The limit values $a_{Mi}$, define boundary conditions for the manipulator travels, which may emerge, for instance, from the maximum deflections of the manipulators M1 to M4, emerging for technical reasons, and the actual positions thereof. The reason for a maximum deflection emerging for technical reasons may lie in, for example, mechanical limits of the manipulators or else in other technical boundary conditions, for example a restriction in the increment for reasons of accuracy or speed.

Figure 2:
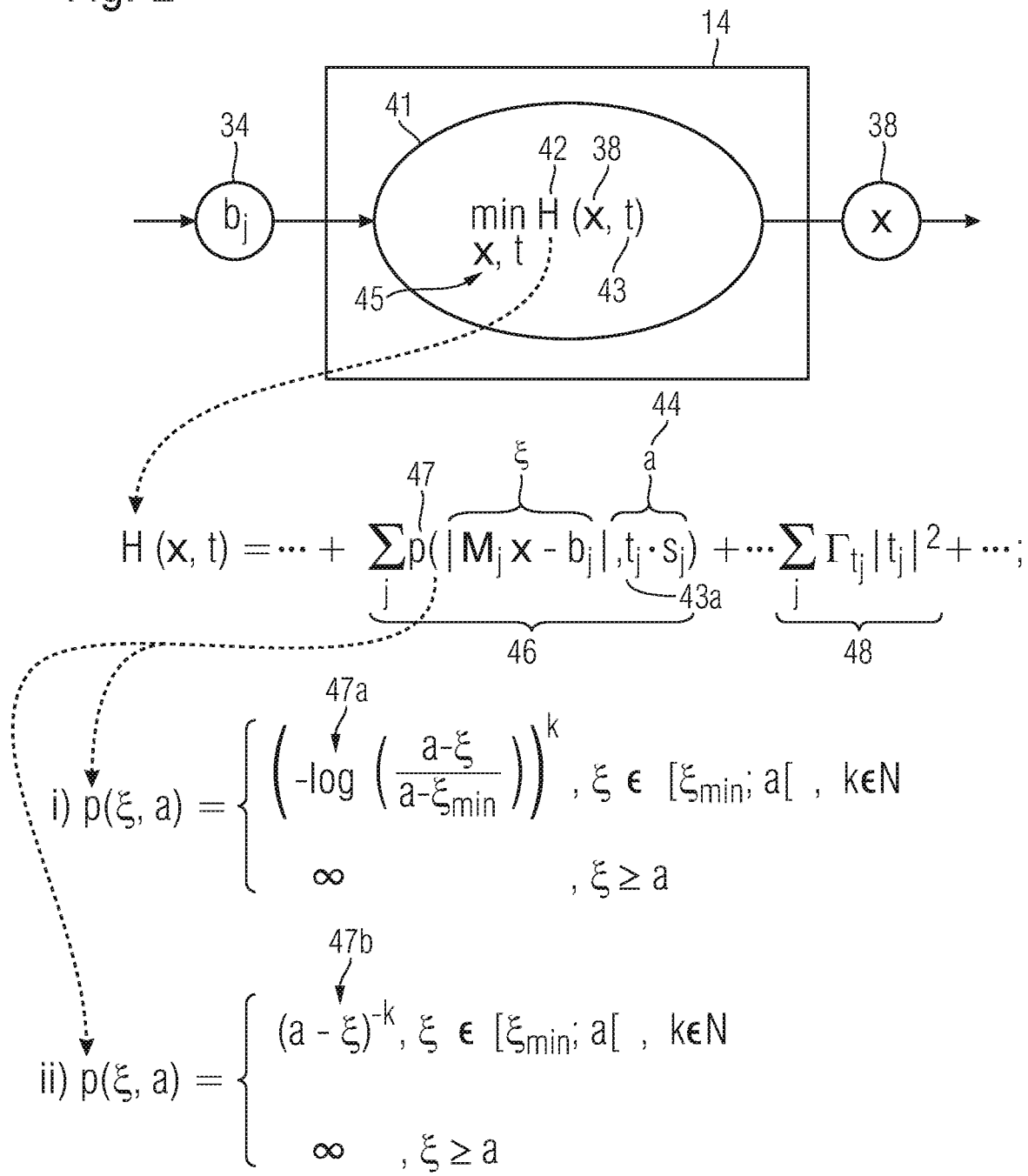
FIG. 2 shows a visualization of the construction of a merit function, which underlies an optimization algorithm carried out by the control apparatus.

As per the embodiment according to FIG. 2, the travel-generating optimization algorithm 41 is configured to solve the following optimization problem:

$$\min_{x,t} H(x, t) \tag{3}$$

Here, the travel variable x and the scaling quantity t serve as optimization variables 45; this should be understood to mean, in particular, that one or more of the vector components of the travel variable x and one or more of the components $t_j$ of the scaling quantity t serve as optimization variables 45 when carrying out the optimization algorithm 41. Hence, with the scaling quantity t, a variable of a different category, i.e., of a category not relating to travel variables, also serves as optimization variable 45 in addition to the travel variables x. Further details with respect to the basic solution of such an optimization problem can be gathered from, for example, WO2010/034674A1, in particular from pages 38 to 45.

The merit function H according to the exemplary embodiment explained here is as follows:

$$H(x, t) = \ldots + \sum_j p(|M_j x - b_j|, t_j \cdot s_j) + \ldots \sum_j \Gamma_{t_j} |t_j|^2 + \ldots \tag{4}$$

Expressed differently, the merit function H includes at least one first penalty term 46 in the form of:

$$\sum_j p(|M_j x - b_j|, t_j \cdot s_j) \tag{5}$$

This term serves to take account of the aforementioned limit a for one or more properties of the projection lens 16 in the form of Zernike coefficients $b_j$ and, optionally, manipulator travels in the merit function H as an implicit constraint.

The penalty term 46 includes a sum of penalty functions p(ξ, a) denoted by the reference sign 47 in FIG. 2, where a is the aforementioned limit and ξ is defined as follows in accordance with the exemplary embodiment explained here:

$$\xi = |M_j x - b_j| \tag{6}$$

Here, $M_j$ denotes the rows of the sensitivity matrix M, x denotes the travel variable and $b_j$ denotes the Zernike coefficients, as described above in each case.

Two embodiment variants are illustrated for the penalty function p(ξ, a) in FIG. 2, firstly, below i), in the form of:

$$p(\xi, a) = \begin{cases} \left(-\log\left(\frac{a - \xi}{a - \xi_{min}}\right)\right)^k, & \xi \in [\xi_{min}; a[, \ k \in \mathbb{N} \\ \infty, & \xi \geq a \end{cases} \tag{7}$$

and, secondly, under ii), in the form of:

$$p(\xi, a) = \begin{cases} (a - \xi)^{-k}, & \xi \in [\xi_{min}; a[, \ k \in \mathbb{N} \\ \infty, & \xi \geq a \end{cases} \tag{8}$$

The penalty function p(ξ, a) is formulated in such a way in each case that the functional value thereof tends to "infinity" when corresponding properties of the projection lens 16 approach the limit a, i.e., the respective limit values $a_j$. This behaviour is brought about by the use of a logarithm function 47a in the penalty function p(ξ, a) according to Expression (7) and by the use of a fractional-rational function 47b in the penalty function p(ξ, a) according to Expression (8), in each case for ξ in the range [$\xi_{min}$; a[, where $\xi_{min}$ denotes the smallest admissible value for ξ. For ξ=a or for values of ξ that exceed the limit a, the following applies: p(ξ, a)=∞. By way of example, the logarithm function used in Expression (7) may relate to the natural logarithm, the logarithm to the base 10 or a logarithm to any other base (in particular a positive base).

Both the logarithm function 47a used in Expression (7) and the fractional-rational function 47b used in Expression (8) are continuously differentiable multiple times in both variables. This applies to a permitted range. This permitted range may include the entire domain of the relevant function, which, in the present case, is the entire range where the value of the logarithm function 47a or of the fractional-rational function does not become infinite. According to one embodiment, the maximum domain possible from a mathematical point of view is restricted by practical boundary conditions. This should be understood to mean that the argument of the function cannot, in practice, assume all values of the maximum domain possible from a mathematical point of view on account of boundary conditions of the manipulation system and/or of the projection exposure apparatus. For instance, an image aberration might thus not be able to be reduced all the way to zero but instead may only approach the absolute value of zero down to a certain value. In particular, a domain that, from a mathematical point of view, has a lower or an upper limit of −∞ or +∞ is restricted to a finite numerical value by practical boundary conditions.

According to a further embodiment, the function is continuously differentiable multiple times in a section, wherein this section makes up more than 90%, in particular more than 98%, more than 99%, more than 99.9% or more than 99.99% of the domain of the function restricted by practical boundary conditions.

This restriction of differentiability to the aforementioned section applies, to particular, to the case where the function is available in numerical representation. Here, the one-time continuous differentiability according to one embodiment is satisfied by virtue of the fact that, at each point of the aforementioned section whose function value exceeds the smallest number representable in a calculation programme of the control apparatus 14 by a factor of 10, a function value, determined by linear approximation, of an associated approximation point deviates by no more than 50% from the actual function value, in particular by no more than 20%, by no more than 10%, by no more than 5% or by no more than 1% from the actual function value, wherein the approximation point associated with the respective point is spaced apart from the point by at least twice, five times or ten times a minimum increment.

According to one embodiment, the two-fold continuous differentiability of the function present in numerical representation is satisfied by virtue of the fact that, at each point of the section whose function value exceeds the smallest number representable in the calculation programme of the control apparatus 14 by a factor of 10, a function value, determined by quadratic approximation, of an associated approximation point deviates by no more than 50% from the actual function value, in particular by no more than 20%, by no more than 10%, by no more than 5% or by no more than 1% from the actual function value, wherein the approximation point associated with the respective point is spaced apart from the point by at least twice the minimum increment, in particular by at least five times or by at least ten times the minimum increment. This applies to each point of the above section whose function value exceeds the smallest number representable in the calculation programme of the control apparatus by a factor of 1000 or $10^6$.

Expressed in general, the mathematical definition of the differentiability is based on the limit value of difference quotient for arbitrarily small changes of the function argument. This limit value cannot be considered strictly in the case of numerical calculations with a finite accuracy of the numerical representation. Rather, what is involved for numerical application is that a continuously differentiable function $f(x)$, for each point $x_0$ in the domain, can be approximated in a certain region around the point $x_0$ by a linear function $\tilde{f}(x) = f(x_0) + \tilde{f}_1(x_0) \cdot (x - x_0)$ with a suitable gradient factor $\tilde{f}_1(x_0)$, which generally depends on $x_0$, with a predetermined accuracy or maximum deviation $\Delta f$, wherein the differentiability allows to equate $$\tilde{f}_1(x_0) = \frac{d}{dx} f(x) \bigg|_{x=x_0}.$$

Then, the following applies: $\|\tilde{f}(x) - f(x)\| < \Delta f$ for $x \in ]x_0 - \in_1, x_0 + \in_1[$ where $\in_1 > 0$. The quantity $\in_1$ specifies a "minimum radius" of the region around $x_0$ in which the function can be linearly approximated with the predetermined maximum deviation $\Delta f$. This "minimum radius" can be chosen to have a different size depending on the point $x_0$. As mentioned above, it should be greater than twice the minimum increment of the numerical representation, i.e., the minimum increment, in the majority of the domain of the function. Naturally, this region should become small in the vicinity of a point of infinity of the function, as for the functions $p(\xi, a)$. According to the embodiment described above, the maximum deviation $\Delta f$ is set to no more than 50% of the function value f.

Quite analogously, the value of a two-fold continuous differentiability in the numerical application lies in the ability to approximate the function by a second-order function $\tilde{f}(x) = f(x_0) + \tilde{f}_1(x_0) \cdot (x - x_0) + \tilde{f}_2(x_0) \cdot (x - x_0)^2$ with a suitable gradient factor $\tilde{f}_1(x_0)$, generally depending on $x_0$, and a suitable "curvature" $\tilde{f}_2(x_0)$, generally depending on $x_0$. Once again, the two-fold differentiability in this case allows to equate $$\tilde{f}_1(x_0) = \frac{d}{dx} f(x) \bigg|_{x=x_0} \text{ and } \tilde{f}_2(x_0) = \frac{d^2}{dx^2} f(x) \bigg|_{x=x_0}.$$

Then, the following applies: $\|\tilde{f}(x) - f(x)\| < \Delta f$ for $x \in ]x_0 - \in_2, x_0 + \in_2[$, where $\in_2 > 0$, once again, specifies a "minimum radius" for the region in which the predetermined accuracy is achieved.

The extension to two-dimensional functions such as, e.g., $p(\xi, a)$ and the differentiability thereof with respect to $\xi$ and a is well-known in mathematics, keywords including, e.g., "partial derivatives" and "total derivative". The explanations made above with respect to differentiability should be understood taking account of the computational accuracy for the numerical application.

Furthermore, with respect to FIG. 2, the availability of the first derivative of the penalty function $p(\xi, a)$ in the range $[\xi_{min}; a[$ allows the optimization algorithm 41 to find its target using the gradient method. As a result of the availability of the second derivative, in particular the availability of even higher derivatives, of the penalty function $p(\xi, a)$ in the range $[\xi_{min}; a[$, the target ascertained by the gradient function can be found in a particularly short time, for example via a large increment.

As is clear from Expression (4) above, the merit function H furthermore includes a second penalty term 48 in the form $$\sum_j \Gamma_{t_j} |t_j|^2 \qquad (9)$$

This term serves to limit the scaling factors $t_j$. Here, the size of the limitation can be set by suitably predetermining the parameter $\Gamma_{t_j}$. Here, a group limit value can be provided according to one embodiment; this group limit value are not to be exceeded by at least one of the individual limit values $a_j$ associated with the scaling factors $t_j$. According to a further embodiment, the penalty term 48 is configured to limit the values of both the scaling factors $t_j$ and the group limit value. Furthermore, a plurality of group limit values and a supragroup limit value may also be provided, wherein the group limit values relate to different groups of scaling factors $t_j$ and the supra-group limit value are not to be exceeded by any of the group limit values. According to a further embodiment, the merit function 42 may include a further penalty term for limiting the group limit value. The described concept can be extended to further cascading with supra-supra-group limit values.

In addition to the penalty terms 46 (Expression (5)) and the penalty term 48 (Expression (9)), the merit function H represented in Expression (4) may optionally include the expression $\|Mx - b\|_2^2$, where b is a vector representation of the Zernike coefficients $b_i$ and $\| \|_2$ denotes the Euclidean norm. Furthermore, the merit function H may optionally include further penalty terms, for instance in order to take account of fading aberrations, overlay errors, boundary conditions of the manipulator system M1 to M4, boundary corrections of the correction asphere ablations to be undertaken via the post-processing device 36 and/or grouped RMS values of the Zernike coefficients $b_j$. A fading aberration should be understood to mean a specification as to how an image aberration changes in the scanning direction of a projection exposure apparatus, i.e. in the direction of the relative movement between the mask and the wafer during the exposure. An overlay error specifies a local image position displacement of an imaged mask structure in relation to the setpoint position thereof on the substrate.

Figure 3:
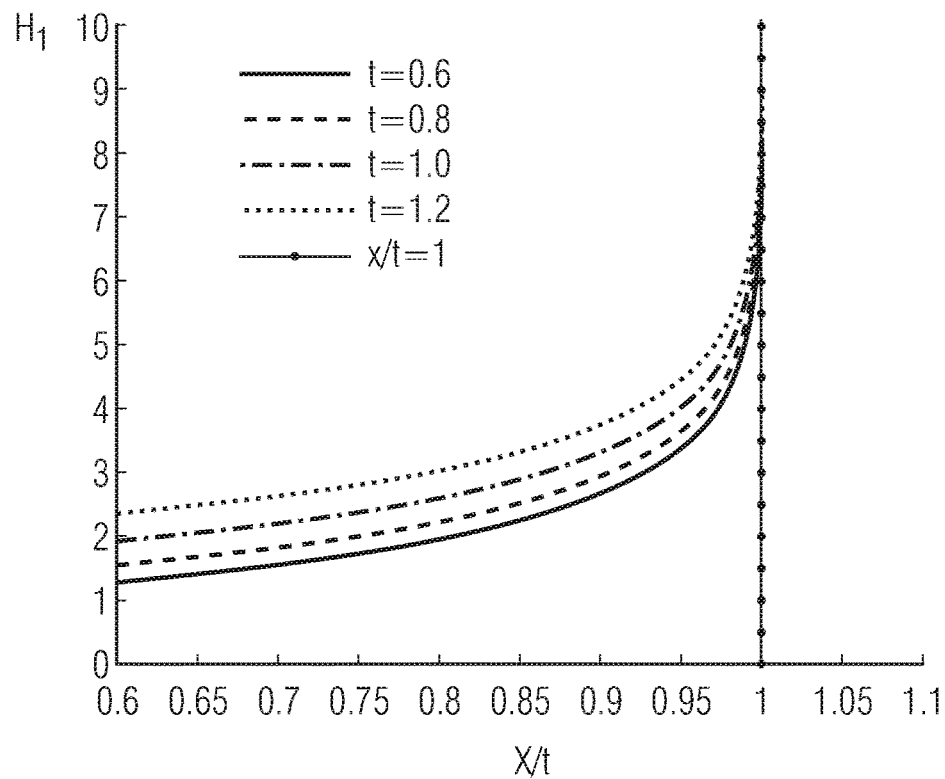
FIG. 3 shows a diagram for visualizing the effect of an embodiment of the merit function according to the disclosure.
Figure 4:
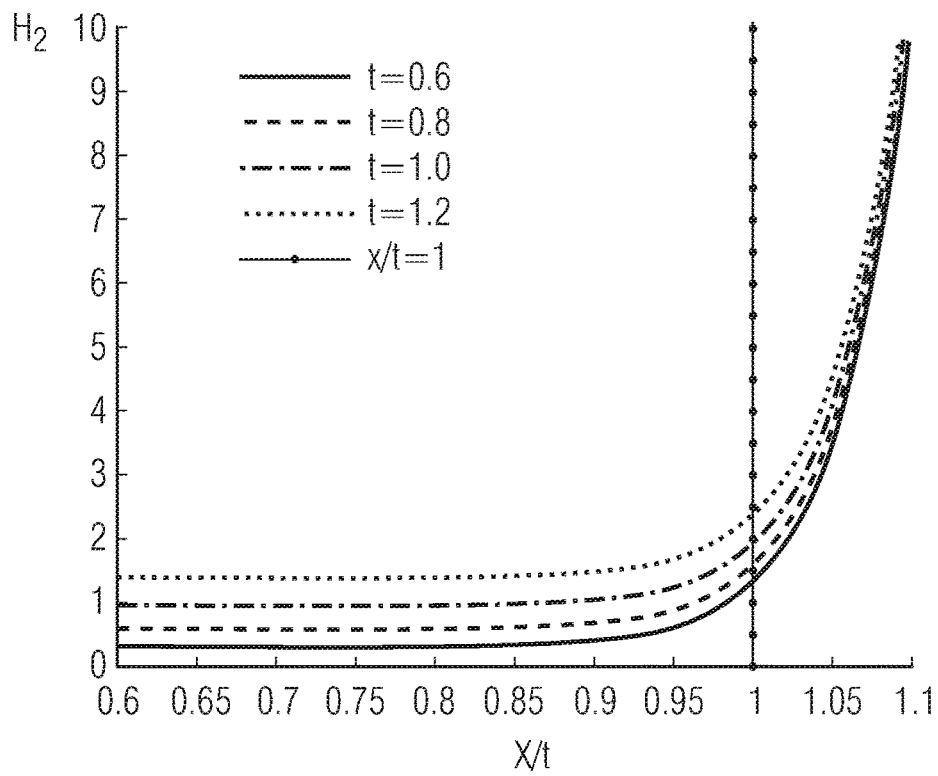
FIG. 4 shows a diagram for visualizing the effect of a comparative example for the merit function.

FIGS. 3 and 4 serve to visualize the effect of the optimization based on the merit function H(x, t) according to the disclosure. To this end, the diagram according to FIG. 3 illustrates the value of the merit function, denoted here by $H_1$ and formed from the sum of the penalty terms 46 and 48, when $\xi$ approaches the limit a. To this end, embodiment variant i), presented under (7), is chosen as penalty function $p(\xi, a)$. For the illustration in the diagram of FIG. 3, the following replacement is made:

$$\chi := \frac{|Mx - b|}{s},$$

where s serves to represent the totality of initial limit values $s_j$. With this replacement and by choosing k=1 and $\xi_{min}=0$, the following expression arises for $H_1$ in the range $\xi \in [\xi_{min}; a[:$ $$H_1(\chi, t) = -\log\left(1 - \frac{\chi}{t}\right) + \Gamma t^2 \quad (10)$$

In the diagram of FIG. 3, the value of $H_1$ is illustrated as a function of $\chi/t$ for different values of t, where $\Gamma=1$. In the diagram, approaching the limit a corresponds to $\chi/t$ approaching the value of "1". As is evident from the diagram, the curve of all represented values of t tends to "infinity" when $\chi/t$ approaches the value of 1. That is to say, $H_1$ is configured in such a way that an infringement of the initial limit values $s_j$ scaled by t is prevented.

By contrast, the diagram in FIG. 4 illustrates the value of a merit function $H_2$ derived from the prior art, when $\xi$ approaches the limit a. This merit function is:

$$H_2(x, t) = \left(\frac{|Mx - b|}{t \cdot s}\right)^{2N} + \Gamma t^2 ; N \in \mathbb{N} \quad (11)$$

The first term $$\left(\frac{|Mx - b|}{t \cdot s}\right)^{2N}$$

of the merit function $H_2$ is based on a merit function, known from the prior art and mentioned at the outset in this document, with a penalty function based on a power with an even exponent. This penalty function known in advance is modified in such a way in this case that, by way of t, a scaling quantity for the limit a is introduced and provided as a further optimization variable in addition to $\chi$. When undertaking the replacement $$\chi := \frac{|Mx - b|}{s}$$

already explained above with respect to $H_1$, the following arises:

$$H_2(\chi, t) = \left(\frac{\chi}{t}\right)^{2N} + \Gamma t^2 \quad (12)$$

In the diagram of FIG. 4, $H_2$ is illustrated as a function of $\chi/t$ for different values of t in a manner analogous to $H_1$ as per FIG. 3, where $\Gamma=1$ and N=12. When approaches the limit a, which corresponds to $\chi/t$ approaching the value of "1" in the diagram, the function value of $H_2$ increases significantly, but not so strongly that the value "1" being exceeded would be reliably prevented. That is to say, the merit function $H_2$ does not prevent an infringement of the initial limit values $s_j$, scaled by t, with sufficient reliability.

Figure 5:
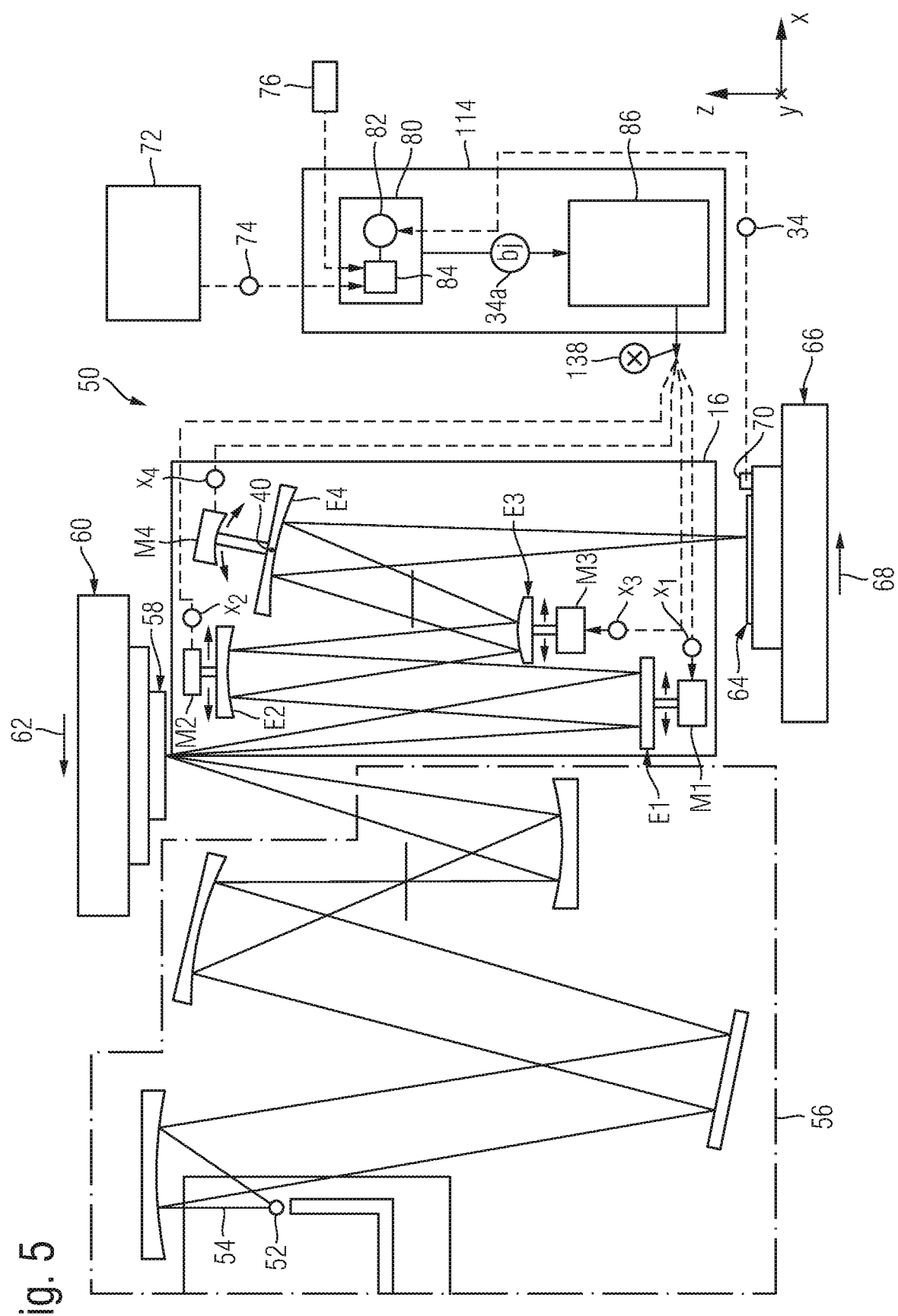
FIG. 5 shows a visualization of an embodiment of a microlithographic projection exposure apparatus according to the disclosure, including a projection lens and a control apparatus for controlling manipulators of the projection lens.

FIG. 5 shows an embodiment according to the disclosure of a microlithographic projection exposure apparatus 50. The present embodiment is designed for operation in the EUV wavelength range. All optical elements are embodied as mirrors as a result of this operating wavelength. However, the disclosure is not restricted to projection exposure apparatuses in the EUV wavelength range. Further embodiments according to the disclosure are designed, for example, for operating wavelengths in the UV range, such as e.g. 365 nm, 248 nm or 193 nm. In this case, at least some of the optical elements are configured as conventional transmission lens elements.

The projection exposure apparatus 50 in accordance with FIG. 5 includes an exposure radiation source 52 for generating exposure radiation 54. In the present case, the exposure radiation source 52 is embodied as an EUV source and it can include, for example, a plasma radiation source. The exposure radiation 54 initially passes through an illumination optical unit 56 and it is deflected onto a mask 58 thereby. The illumination optical unit 56 is configured to generate different angle distributions of the exposure radiation 54 incident on the mask 58. Depending on an illumination setting desired by the user, the illumination optical unit 56 configures the angle distribution of the exposure radiation 54 incident on the mask 58. Examples for selectable illumination settings include a so-called dipole illumination, annular illumination and quadrupole illumination.

The mask 58 has mask structures to be imaged on a substrate 64 in the form of a wafer and it is displaceably mounted on a mask displacement stage 60. As depicted in FIG. 5, the mask 58 can be embodied as a reflection mask or, alternatively, it can also be configured as a transmission mask, in particular for UV lithography. In the embodiment in accordance with FIG. 5, the exposure radiation 54 is reflected at the mask 58 and it thereupon passes through the projection lens 16, which was already described with reference to the adjustment arrangement 10 in accordance with FIG. 1. The projection lens 16 serves to image the mask structures of the mask 58 on the substrate 64. The exposure radiation 54 is guided within the projection lens 16 via a multiplicity of optical elements, presently in the form of mirrors. The substrate 64 is displaceably mounted on a substrate displacement stage 66.

The projection exposure apparatus 50 can be designed as a so-called scanner or a so-called stepper.

In the case of the embodiment as a scanner, which is also referred to as a step- and scan projection exposure apparatus, the mask displacement stage 60 and the substrate displacement stage 66 are moved in coordinated fashion during each instance of imaging the mask 58 on the substrate 64, i.e. each instance of exposing a field on the substrate 64. As shown in FIG. 5, in this case, the mask displacement stage 60 moves in a scanning direction 62 and the substrate displacement stage moves in a scanning direction 68. The fading aberrations mentioned above can be traced back to the scanning movements during the field exposure of such a scanner.

The projection exposure apparatus 50 furthermore includes a central control device 72 for controlling the exposure process, including the mask displacement stage 60 and the substrate displacement stage 66. Moreover, the projection exposure apparatus 50 includes a control apparatus 114 for controlling the manipulators M1 to M4. The control apparatus 114, in turn, includes a state encoder 80 and a travel ascertaining device 86. The state encoder 80 transmits current state characterisations 34a of the projection lens 16 to the travel ascertaining device 86, which generates a travel command 138 therefrom. The travel command 138 includes travels $x_i$, in the shown case the travels $x_1$, $x_2$, $x_3$ and $x_4$. These travels serve to control the manipulators M1 to M4, as described in more detail above in relation to the adjustment arrangement 10 in accordance with FIG. 1.

The travel command 138 generated by the travel ascertaining device 86 includes modifications to be carried out by the manipulators M1 to M4 in the form of state variables of the optical elements E1 to E4 corresponding to travels $x_i$. The ascertained travels $x_i$ are communicated to the individual manipulators M1 to M4 via travel signals and predefine for them respective correction travels to be performed. These define corresponding displacements of the assigned optical elements E1 to E4 for correcting wavefront errors of the projection lens 16 that occurred. In order to ascertain the travels $x_i$, the travel ascertaining device 86 receives respectively updated state characterisations 34a in the form of Zernike coefficients $b_j$ characterizing the wavefront from the state encoder 80, in particular when the exposure process is carried out.

In accordance with one embodiment, the travel ascertaining device 86 generates travels $x_i$ which are updated a number of times during the exposure of a substrate 64. In accordance with one embodiment, the state encoder 80 has a memory 82 and a simulation device 84. State characterisations 34 in the form of aberration parameters, which were ascertained at the projection lens 16 via a wavefront measurement, are stored in the memory 82. These measurement results can be gathered via an external wavefront measurement apparatus, such as the measurement apparatus 12 described with reference to FIG. 1. Alternatively, however, the state characterizations 34 can also be measured by a wavefront measurement device 70 integrated in the substrate displacing stage 66. By way of example, such a measurement can take place regularly after each exposure of a wafer or in each case after exposing a complete set of wafers. Alternatively, it is also possible to undertake a simulation or a combination of a simulation and a reduced measurement instead of a measurement.

The measurement values of the state characterization 34 in the form of aberration parameters in the form of Zernike coefficients, stored in the memory 82, are adapted to updated conditions during the exposure process in each case by way of the simulation device 84 where desired. In accordance with one embodiment variant, the central control device 72 regularly transfers the current irradiation intensity 74 to the simulation device 84. From this and on the basis of the respective illumination setting, the simulation device 84 calculates changes, caused by lens element heating, in the aberration parameters. Furthermore, the simulation device continuously obtains measurement values from a pressure sensor 76 monitoring the ambient pressure of the projection exposure apparatus 50. Effects of modifications in the ambient pressure on the aberration parameters are taken into account by the simulation device 84.

The control device 114 of the projection exposure apparatus 50 in accordance with FIG. 5 differs from the control device 14 of the adjustment arrangement 10 in accordance with FIG. 1 in that, by way of the state encoder 80, the control device 114 converts the state characterization 34 measured by a wavefront measurement device into a current state characterization 34a using the current illumination intensity 74. The function of the travel ascertaining device 86 of the control apparatus 114 corresponds to the function of the control device 14, but with the constraint that the travel command 138 generated by the control apparatus 114 only includes the travel variable x with the travels $x_i$ of the manipulators, but not the travel vector $x^L$ for controlling the correction asphere post-processing device 36. The properties of the control device 14 of the adjustment arrangement 10, described with reference to FIGS. 2 to 4, apply analogously to the properties of the travel ascertaining device 86 of the control apparatus 114.

The above description of exemplary embodiments, embodiments or embodiment variants is to be understood to be by way of example. The disclosure effected thereby firstly enables the person skilled in the art to understand the present disclosure and the advantages associated therewith, and secondly encompasses alterations and modifications of the described structures and methods that are also obvious in the understanding of the person skilled in the art. Therefore, all such alterations and modifications, insofar as they fall within the scope of the disclosure in accordance with the definition in the accompanying claims, and equivalents are intended to be covered by the protection of the claims.

LIST OF REFERENCE SIGNS

10 Adjustment arrangement
12 Measurement apparatus
14 Control apparatus
16 Projection lens
18 Illumination device
20 Measurement radiation
22 Measurement mask
24 Object plane
26 Sensor element
28 Image plane
30 Detector
32 Evaluation device
34 State characterization
34a Current state characterization
36 Post-processing device
38 Travel command in the form of a travel variable x
40 Tilt axis
41 Optimization algorithm
42 Merit function H
43 Scaling quantity t
43a Scaling factor $t_j$
44 Limit a
45 Optimization variables
46 First penalty term
47 Penalty function
47a Logarithm function
47b Fractional-rational function
48 Second penalty term
50 Projection exposure apparatus
52 Exposure radiation source
54 Exposure radiation
56 Illumination optical unit
58 Mask
60 Mask displacement stage
62 Scanning direction of the mask displacement stage
64 Substrate
66 Substrate displacement stage
68 Scanning direction of the substrate displacement stage
70 Wavefront measurement device 72 Central control unit
74 Current irradiation intensity
76 Pressure sensor
80 State encoder
82 Memory
84 Simulation unit
86 Travel ascertaining device
114 Control apparatus
138 Travel command
E1-E4 Optical elements
M1-M4 Manipulators
$x_1$ Travels for manipulators
$x_n^L$ Travels for the correction asphere post-processing device

What is claimed is:

1. A control apparatus, wherein:
   the control apparatus is configured to control a manipulator configured to modify a parameter of a microlithographic projection exposure apparatus by generating a target for a travel variable that defines a modification of the parameter to be undertaken via the manipulator;
   the control apparatus is configured to generate the target by optimizing a merit function from a state characterization of the microlithographic projection exposure apparatus;
   the merit function comprises a penalty term to take account of a limit for a property of the microlithographic projection exposure apparatus;
   the penalty term is formulated so that its function value prevents the limit for the property of the microlithographic projection exposure apparatus from being exceeded; and
   the property of the microlithographic projection exposure apparatus for which the penalty term comprises a limit includes an imaging aberration of a projection lens of the microlithographic projection exposure apparatus.

2. The control apparatus of claim 1, wherein the penalty term comprises a function that, in a section, is at least once continuously differentiable.

3. The control apparatus of claim 2, wherein:
   the function is available in a numerical representation with a minimum increment;
   the continuous differentiability is satisfied by virtue of the fact that, at each point of the section where the function value exceeds a smallest number representable in a calculation program of the control apparatus by a factor of 10, a function value, determined by a linear approximation, of an associated approximation point deviates by no more than 50% from an actual function value; and
   the approximation point associated with the respective point is spaced apart from the point by at least twice the minimum increment.

4. The control apparatus of claim 2, wherein the function, at least in the section, is at least twice continuously differentiable.

5. The control apparatus of claim 2, wherein the function at least approximately comprises a logarithm function.

6. The control apparatus of claim 2, wherein the function at least approximately comprises a fractional-rational function.

7. The control apparatus of claim 2, wherein the property of the microlithographic projection exposure apparatus for which the penalty term comprises a limit includes the target for the travel variable.

8. The control apparatus of claim 2, wherein the control apparatus is configured to implement the target by optimizing the merit function via the travel variable, which serves as a first optimization variable, and via a further optimization variable of another category.

9. The control apparatus of claim 1, wherein the penalty term is formulated so that its function value is defined as infinite when the limit is exceeded.

10. The control apparatus of claim 1, wherein the control apparatus is configured to implement the target by optimizing the merit function via the travel variable, which serves as a first optimization variable, and via a further optimization variable of another category.

11. The control apparatus of claim 10, wherein the further optimization variable comprises a scaling factor for scaling the limit.

12. The control apparatus of claim 11, wherein the merit function comprises a further penalty term for limiting the value of the scaling factor.

13. The control apparatus of claim 10, wherein:
   the limit comprises a plurality of individual limit values for a respective property of the microlithographic projection exposure apparatus; and
   the further optimization variable comprises a plurality of scaling factors for scaling the individual limit values and a group limit value, which may not be exceeded by at least one of the individual limit values.

14. The control apparatus of claim 1, wherein the property of the microlithographic projection exposure apparatus for which the penalty term comprises a limit includes the target for the travel variable.

15. An arrangement, comprising:
   a measurement apparatus configured to ascertain a state characterization of the projection lens; and
   a control apparatus according to claim 1,
   wherein the control apparatus is configured to generate the target for a travel variable from the state characterization.

16. A lens, comprising:
   a manipulator configured to modify a parameter of the lens; and
   a control apparatus according to claim 1,
   wherein the control apparatus is configured to control the manipulator, and the lens is a microlithographic projection lens.

17. An apparatus, comprising:
   a manipulator configured to modify a parameter of a projection lens of the apparatus; and
   a control apparatus according to claim 1,
   wherein the control apparatus is configured to control the manipulator, and the apparatus is a microlithographic projection exposure apparatus.

18. A method for controlling a manipulator to modify a parameter of a microlithographic projection exposure apparatus, the method comprising:
   generating a target for a travel variable for the at least one manipulator from a state characterization of the microlithographic projection exposure apparatus by optimizing a merit function, the merit function comprising a penalty term for taking account of a limit for a property of the microlithographic projection exposure apparatus, the penalty term formulated so that its function value prevents the limit for the property of the microlithographic projection exposure apparatus from being exceeded; and
   modifying the parameter of the microlithographic projection exposure apparatus via the at least one manipulator on the basis of the generated target for the travel variable, wherein the property of the microlithographic projection exposure apparatus for which the penalty term comprises a limit includes an imaging aberration of a projection lens of the microlithographic projection exposure apparatus.

19. The control apparatus of claim 1, wherein the imaging aberration comprises a Zernike image aberration.

20. The control apparatus of claim 1, wherein the imaging aberration comprises a lithographic error.

* * * * *

UNITED STATES PATENT AND TRADEMARK OFFICE
CERTIFICATE OF CORRECTION

PATENT NO. : 10,852,642 B2
APPLICATION NO. : 16/734082
DATED : December 1, 2020
INVENTOR(S) : Bjoern Butscher and Christian Wald It is certified that error appears in the above-identified patent and that said Letters Patent is hereby corrected as shown below:

In the Specification

Column 14, Line 38, delete "supragroup" and insert -- supra-group --;

Column 14, Line 50, delete "$b_i$" and insert -- $b_j$ --;

Column 19, Line 12, delete "$x_1$" and insert -- $x_i$ --.

Signed and Sealed this
Sixteenth Day of February, 2021

Drew Hirshfeld
*Performing the Functions and Duties of the*
*Under Secretary of Commerce for Intellectual Property and*
*Director of the United States Patent and Trademark Office*